(12) United States Patent
Tanzawa

(10) Patent No.: US 8,184,489 B2
(45) Date of Patent: May 22, 2012

(54) LEVEL SHIFTING CIRCUIT

(75) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 204 days.

(21) Appl. No.: 12/774,287

(22) Filed: May 5, 2010

(65) Prior Publication Data

US 2011/0273940 A1    Nov. 10, 2011

(51) Int. Cl.
*G11C 7/00* (2006.01)
(52) U.S. Cl. .................. 365/189.11; 365/189.05
(58) Field of Classification Search ............ 365/189.11, 365/189.05
See application file for complete search history.

(56) References Cited

U.S. PATENT DOCUMENTS

| | | | | |
|---|---|---|---|---|
| 3,731,287 A | * | 5/1973 | Seely et al. | 365/78 |
| 6,424,585 B1 | * | 7/2002 | Ooishi | 365/226 |
| 6,504,778 B1 | * | 1/2003 | Uekubo | 365/189.15 |
| 6,914,812 B2 | * | 7/2005 | Owen | 365/185.02 |
| 7,272,046 B2 | | 9/2007 | Tanzawa | |
| 7,609,554 B2 | * | 10/2009 | Tanzawa | 365/185.18 |
| 7,777,553 B2 | * | 8/2010 | Friedrichs | 327/436 |

\* cited by examiner

*Primary Examiner* — Tuan T. Nguyen
(74) *Attorney, Agent, or Firm* — Leffert Jay & Polglaze, P.A.

(57) ABSTRACT

A level shifting circuit having an input and an output where the level shifting circuit is configured to receive a logical high level having a first voltage level at the input and to output a logical high level having a second voltage level at the output where the second voltage level is higher than the first voltage level. Level shifting circuit embodiments having two or more parallel coupled depletion mode transistors coupled to a high voltage source and further coupled to the output by an enhancement mode transistor, and an additional transistor coupled between a first signal and the output of the level shifting circuit where the first signal has the same logic level of the input are disclosed.

25 Claims, 11 Drawing Sheets

//LEVEL SHIFTING CIRCUIT

TECHNICAL FIELD

The present disclosure relates generally to voltage level shifting circuits and, in particular, in one or more embodiments, the present disclosure relates to non-volatile memory devices utilizing level shifting circuits.

BACKGROUND

Level shifting circuits are used in a variety of applications where voltages of varying levels (e.g., supplied by multiple voltage sources) are utilized, such as might be used in memory devices, for example. Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its stored data for some extended period without the application of power. Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand. Flash memory devices typically require relatively large voltages for programming and erasing operations. For example, a Flash memory device may have a supply voltage (e.g., Vcc) of 3V but require a program voltage (e.g., Vpp) of 20V to be used during programming and/or erase operations on the memory device.

FIG. 1A illustrates a typical prior art level shifting circuit 100. Level shifting circuits can be used to interface between components and/or blocks of circuitry which are powered by different supply voltages. For example, a portion of the control circuitry (e.g., logic circuitry) in a memory device may operate at a Vcc of 3V. However, this logic circuitry must be able to interface (e.g., level shift signals) with components coupled to and configured to switch high voltages, such as components configured to apply programming and/or erase voltages to memory cells in the memory device, for example.

The circuit shown in FIG. 1A includes an enhancement mode n-channel field effect transistor (NFET) 102 connected to an enhancement mode p-channel field effect transistor (PFET) 104 at Vout node 124, which comprises Vout of the circuit 100. The gate of the enhancement mode NFET 102 is connected to Vcc 120. A depletion mode NFET 106 is connected between the enhancement mode PFET 104 and a high voltage source Vpp 108 to be switched. The gate of the depletion mode NFET 106 is connected to Vout node 124. The substrate or well of the enhancement mode PFET 104 is connected to the depletion mode NFET 106 at node 128. A first inverter INV1 114 inverts the input voltage ($V_{IN}$) signal 118. The output of the first inverter 114 is connected to the gate of the enhancement mode PFET 104 and to the input of a second inverter INV2 116 by node 122. The output of the second inverter INV2 116 is connected to the enhancement mode NFET 102 by node 126.

A voltage level representative of a logical '0' (e.g., ground potential) at $V_{IN}$ 118 is inverted to a logical '1' (e.g., Vcc), i.e., an opposite logic level, at the output of the first inverter INV1 114 at node 122. The logical 1 on node 122 turns off the enhancement mode PFET 104. The second inverter INV2 116 inverts the logical 1 at node 122 to a logical 0 at node 126. As the gate of the enhancement mode NFET 102 is biased to Vcc 120 (e.g., 3V), the logical 0 (e.g., ground potential) at node 126 causes the enhancement mode NFET 102 to turn on pulling the Vout node 124 to a low potential. Thus, a logical 0 at $V_{IN}$ causes the enhancement mode NFET 102 to act as a pass through gate resulting in a logical 0 at Vout node 124.

A logical 1 (e.g., Vcc) at $V_{IN}$ is inverted by the first inverter INV1 114 to a logical 0 at node 122. This enables the enhancement mode PFET 104 whose gate is connected to node 122. The logical 0 at node 122 causes the second inverter INV2 to drive its output to a logical 1 (e.g., 3V) at node 126. The logical 1 at node 126 and Vcc 120 on the gate of the enhancement mode NFET 102 disables the enhancement mode NFET 102. Although the enhancement mode NFET 102 is disabled, node 124 is initially biased up to (Vcc−Vtn) due to the presence of Vcc on the gate of enhancement mode NFET 102, where Vtn is the threshold voltage of enhancement mode NFET 102. This initial bias condition begins to bias the gate of depletion mode NFET 106 which begins to turn on. As the depletion mode NFET 106 begins to turn on, Vout is pulled up to Vpp through the activated enhancement mode PFET 104 and the activated depletion mode NFET 106.

FIG. 1B shows a typical example of the relationship between input and output levels of the circuit shown in FIG. 1A. It can be seen that as $V_{IN}$ of the top waveform increases to Vcc (e.g., 3V) the lower waveform Vout rises to Vpp (e.g., 20V). It should be noted that the waveforms shown in FIG. 1B are not necessarily drawn to scale.

One problem with the prior art switching circuit shown in FIG. 1A is that during the transition from a low $V_{IN}$ (e.g., logical 0) to a high $V_{IN}$ (e.g., logical 1) the Vout node 124 is initially biased, along with the gate of depletion mode NFET 106, to (Vcc−Vtn) as discussed above. The presence of (Vcc−Vtn) on the gate of the depletion mode NFET 106, causes node 128 to be initially biased to $V_{NODE128}=(|Vtd|+Vcc-Vtn)$ where Vtd is the threshold voltage of the depletion mode NFET 106. If the voltage at node 128 is less than the threshold voltage (Vtp) of the enhancement mode PFET 104, the enhancement mode PFET 104 will be cut off and will not allow the Vout node 124 to be pulled up to Vpp 108 resulting in an operation failure of the circuit. During this failure scenario, the final output level of Vout node 124 might never reach Vpp 108 and may not rise above the level (Vcc−Vtn) 130 shown in FIG. 1B. For example, Vout 124 might not rise above 2.3V (e.g., 3V-0.7V) instead of rising to the desired level of Vpp 108. This problem can be aggravated by a trend to reduce the operating voltages (e.g., Vcc) and/or the need to use higher power handling transistors (e.g., which may have higher threshold voltages) used in many semiconductor devices, including such devices as non-volatile FLASH memory devices, for example.

For the reasons stated above, and for other reasons stated below which will become apparent to those skilled in the art upon reading and understanding the present specification, there is a need in the art for a level shifting circuit having improved operating characteristics.

DETAILED DESCRIPTION

Figure 1A:
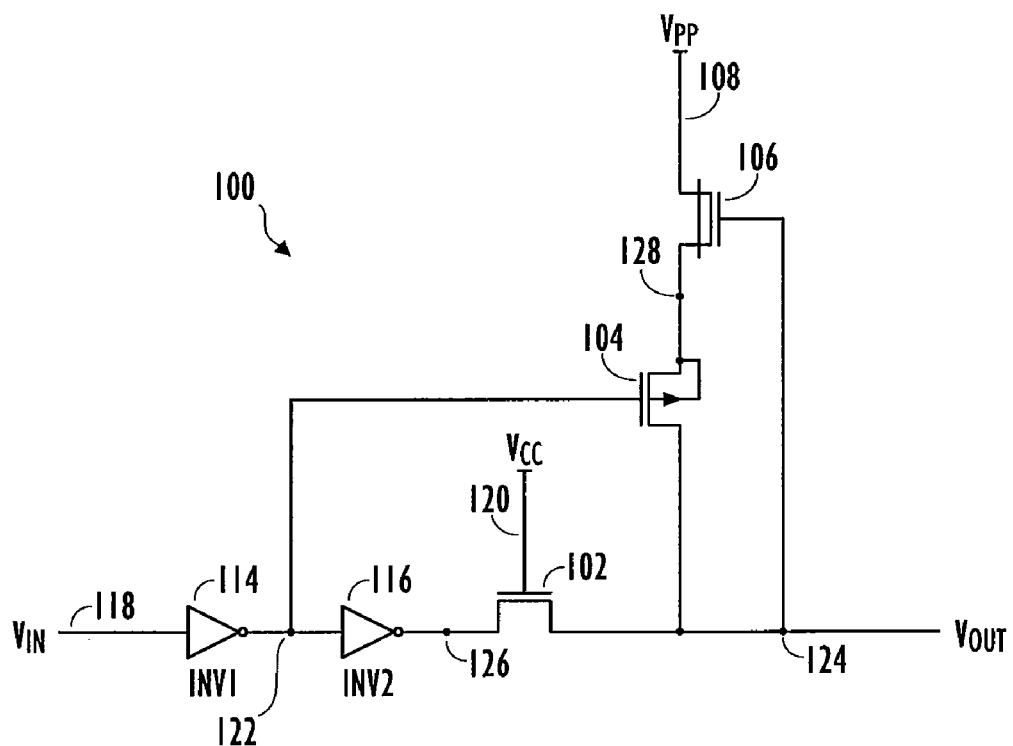
FIG. 1A shows a circuit diagram of a typical prior art level shifting circuit.
Figure 1B:
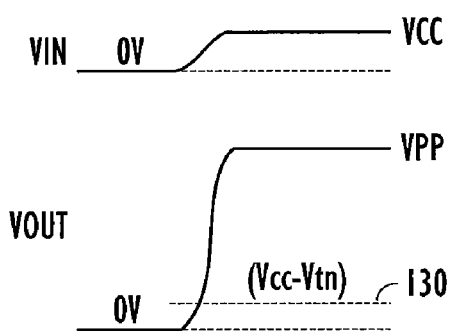
FIG. 1B shows a waveform plot of the operating characteristics of the circuit shown in FIG. 1A.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The term "semiconductor" can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the semiconductor structure, and the term semiconductor can include underlying layers containing such regions/junctions. The following detailed description is, therefore, not to be taken in a limiting sense, and the scope of the present invention is defined only by the appended claims and equivalents thereof.

Figure 2A:
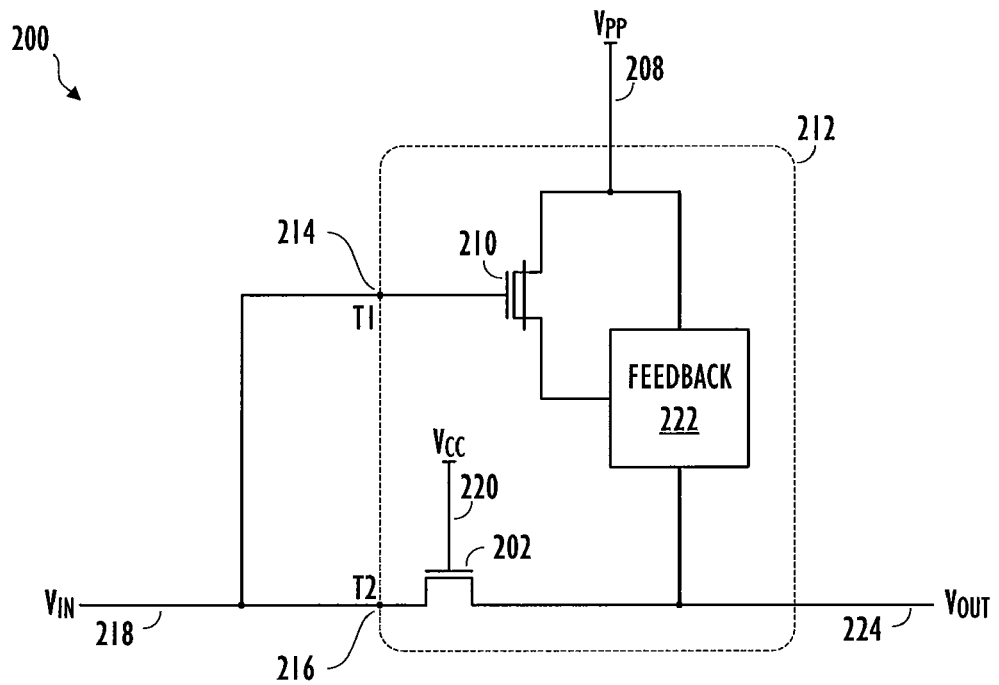
FIG. 2A shows a circuit diagram of a level shifting circuit according to an embodiment of the present disclosure.

FIG. 2A illustrates a circuit diagram 200 of a level shifting circuit 212 according to one or more embodiments of the present disclosure. The circuit shown in FIG. 2A includes two terminals T1 214 and T2 216. The circuit shown in FIG. 2A also comprises an output node Vout 224. A transistor 202 (e.g., an enhancement mode NFET) is connected to terminal T2 216 and to the Vout node 224. The gate of the enhancement mode NFET 202 is coupled to a first voltage source 220 having a particular value which might or might not be a fixed potential, such as Vcc, for example. The level shifting circuit 212 also comprises a feedback circuit 222 (e.g., positive feedback loop circuit) connected between the Vout node 224 and a second voltage source 208 having a particular value which might or might not be a fixed potential, such as Vpp, for example. The voltage source 208 might supply a programming voltage (e.g., 20V) such as might be utilized during a programming operation in a FLASH memory device, for example. An additional transistor 210 (e.g., a depletion mode NFET) is connected between the second voltage source Vpp 208 and the feedback circuit 222. The gate of the depletion mode NFET 210 is connected (e.g., gate connected) to terminal T1 214. Terminals T1 214 and T2 216 might be connected to the same voltage input $V_{IN}$ 218 according to various embodiments of the present disclosure, for example.

Figure 2B:
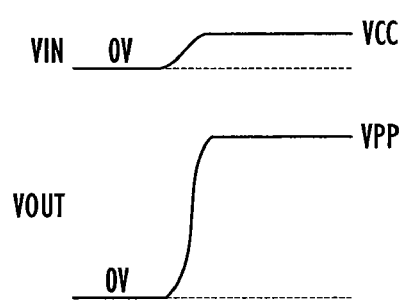
FIG. 2B shows a waveform plot of the operating characteristics of the circuit shown in FIG. 2A.

FIG. 2B shows a waveform plot of the operating characteristics of the level shifting circuit shown in FIG. 2A. $V_{IN}$ 218 might be a logic level signal having a range between a ground potential, such as 0V, and Vcc 220, for example. When $V_{IN}$ 218 transitions to a high potential, such as to Vcc 220, depletion mode NFET 210 turns on and the positive feedback circuit 222 begins raising Vout 224 up to the voltage potential of the Vpp voltage source 208. When $V_{IN}$ 218 transitions low, such as to a ground potential, enhancement mode NFET 202 turns on and the feedback circuit 222 starts to disconnect Vout 224 from Vpp 208. As a result, the Vout 224 node is biased to a low, e.g., ground, potential.

Figure 3:
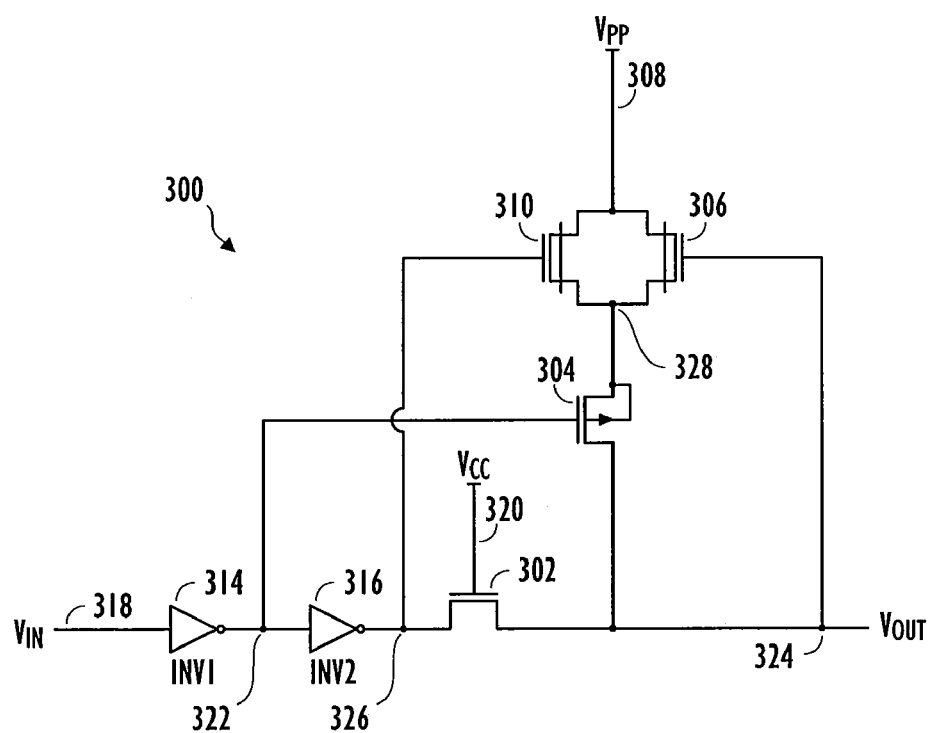
FIG. 3 shows a circuit diagram of a level shifting circuit according to an embodiment of the present disclosure.

FIG. 3 illustrates a diagram of a level shifting circuit 300 according to one or more embodiments of, the present disclosure. The circuit shown in FIG. 3 includes a transistor, e.g., an enhancement mode NFET, 302 connected to a transistor, e.g., an enhancement mode PFET, 304 at Vout node 324. The gate of the enhancement mode NFET 302 is coupled to a voltage source 320, such as Vcc, for example. A transistor, e.g., a depletion mode NFET, 306 is connected between the enhancement mode PFET 304 and a voltage source 308 having a higher potential than that of the voltage source 320, such as Vpp, for example. The gate of the depletion mode NFET 306 is connected (e.g., gate connected) to Vout node 324. The depletion mode NFET 306 and the enhancement mode PFET 304 together serve as a feedback (e.g., positive feedback) circuit, such as feedback circuit 222 shown in FIG. 2A, for example. A transistor, e.g., a second depletion mode NFET, 310 is connected in parallel by source/drain (S/D) regions with the depletion mode NFET 306. The gate of the second depletion mode NFET 310 is connected to the output of inverter INV2 316 by node 326.

Inverter INV1 314 inverts an input voltage ($V_{IN}$) signal 318. The input voltage $V_{IN}$ might be a logic level signal (e.g., logical 1 or 0) generated by an output of control circuitry (not shown), such as to control the application of the high voltage Vpp during a programming operation of a memory device, for example. The output of inverter INV1 314 is connected by node 322 to the gate of the enhancement mode PFET 304 and to the input of inverter INV2 316. The output of inverter INV2 316 is connected by node 326 to the enhancement mode NFET 302 and to the gate of the second depletion mode NFET 310. Circuitry comprising INV1 314 and INV2 316 might be supplied (not shown) by Vcc and the output levels of inverters INV1 314 and INV2 316 might range from 0V to Vcc, for example. Table 1 illustrates a chart of signal levels and the status (e.g., activated/deactivated) of various transistors of FIG. 3 according to one or more embodiments of the present disclosure.

TABLE 1

| $V_{IN}$ | Node 322 | Transistor 304 | Node 326 | Transistor 310 | Transistor 302 |
|---|---|---|---|---|---|
| Logic 0 | Logic 1 | Deactivated | Logic 0 | Deactivated | Activated |
| Logic 1 | Logic 0 | Activated | Logic 1 | Activated | Deactivated |

Referring to Table 1 and FIG. 3, a voltage level representative of a logical 0 at $V_{IN}$ 318 is inverted to a logical 1 at the output of inverter INV1 314. The logical 1 at node 322 turns off the enhancement mode PFET 304. Inverter INV2 316 whose input is connected to the output of inverter INV1 314 at node 322 inverts the logical 1 to a logical 0 at its output coupled to node 326. As the gate of the enhancement mode NFET 302 is biased to Vcc 320 (e.g., 3V), the logical 0 (e.g., 0V) at node 326 causes the enhancement mode NFET 302 to turn on pulling Vout node 324 to a low potential (e.g., logical 0.) Thus, a logical 0 at $V_{IN}$ causes the enhancement mode NFET 302 to act as a pass through gate resulting in a logical 0 at Vout node 324.

A logical 1 at $V_{IN}$ is inverted by inverter INV1 314 to a logical 0 at node 322. This activates the enhancement mode PFET 304 which is gate connected to node 322. The logical 0 at node 322 causes inverter INV2 316 to drive its output to a logical 1 at node 326. The logical 1 at node 326 along with Vcc 320 on the gate of the enhancement mode NFET 302 disables the enhancement mode NFET 302. Although the enhancement mode NFET 302 is disabled, Vout node 324 is initially biased up to (Vcc−Vtn) in response to a transition from a logical 0 to a logical 1 at $V_{IN}$ 318, where Vtn is the threshold voltage of the enhancement mode NFET 302. Vtn of enhancement mode NFET 302 might be 0.7V, for example. This initial bias condition of Vout node 324 also biases the gate of the depletion mode NFET 306. As enhancement mode NFET 306 begins to turn on, Vout node 324 is pulled up to Vpp through the activated enhancement mode PFET 304 and the depletion mode NFET 306 transistors.

Referring to the circuit 100 shown in FIG. 1A, the circuit might have a minimum operating Vcc of 2.5V, for example. Thus, a Vcc of less than 2.5V would cause the failure condition discussed above with respect to FIG. 1A where the initial voltage present at node 128 is too low to allow the enhancement mode PFET 104 to turn on, thus preventing the output from being pulled up to Vpp. For example, in the circuit 100 shown in FIG. 1A, the initial voltage present on node 128 is $V_{NODE128}=(|Vtd|+Vcc-Vtn)$ which as discussed above, needs to be equal to, or greater than the threshold voltage Vtp of the enhancement mode PFET 104 to ensure reliable operation of the circuit.

Referring again to FIG. 3, various embodiments of the present disclosure facilitate a reduction in the minimum operating voltage (e.g., Vcc) required for reliable operation of the circuit 300. The second depletion mode NFET 310 shown in FIG. 3 facilitates the reduction in the minimum required supply voltage to maintain reliable operation. For example, during a transition of $V_{IN}$ from a logical 0 to a logical 1, the depletion mode NFET 310 connected in parallel with depletion mode NFET 306 initially biases node 328 to $V_{NODE328}=(|Vtd|+Vcc)$, where Vtd is the threshold voltage of the depletion mode NFET 310. This is because of the Vcc (e.g., logical 1) present on the gate of depletion mode NFET 310 provided by the output of inverter INV2 316. Thus, reliable operation is maintained if the initial potential on node 328 satisfies $(|Vtd|+Vcc)>Vtp$, where Vtp is the threshold voltage of the enhancement mode PFET 304.

Thus, it has been shown that one or more embodiments of the present disclosure removes the dependence of the initial voltage requirement of node 328 by the value of Vtn of enhancement mode NFET 302. Therefore, various embodiments of the present disclosure allow for a reduction in minimum supply voltage level by an amount equal to the Vtn of the enhancement mode NFET 302, for example. The various embodiments also allow for the use of enhancement mode PFETs (e.g., 304) and/or depletion mode NFETs (e.g., 306) having higher threshold voltages due to increased voltage handling capabilities, for example. For example, given a particular Vcc, an enhancement mode PFET 304 having a higher threshold voltage might be used that still allows for reliable operation of the level shifting circuit according to one or more embodiments of the present disclosure.

Figure 4:
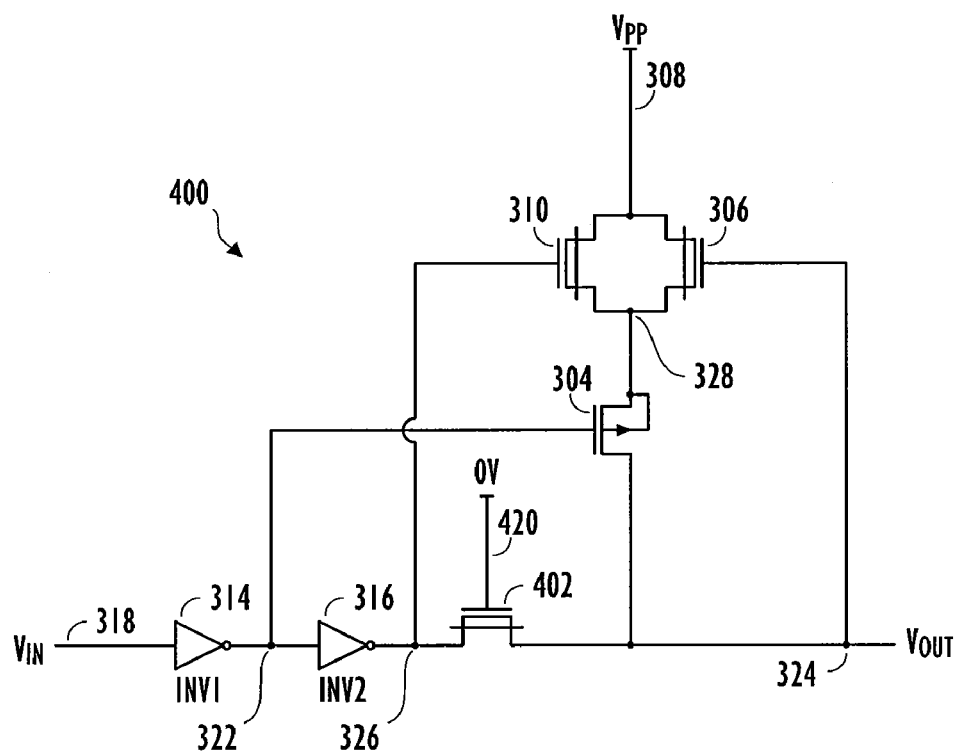
FIG. 4 shows a circuit diagram of an additional level shifting circuit according to an embodiment of the present disclosure.

FIG. 4 shows a circuit diagram 400 according to one or more embodiments of the present disclosure. The circuit shown in FIG. 4 is similar to the circuit shown in FIG. 3. However, it should be noted that the enhancement mode NFET 302 of FIG. 3 has been replaced by a depletion mode NFET 402 as shown in FIG. 4. An enhancement mode NFET, such as NFET 302, will be designed with a breakdown voltage of at least Vpp. This high breakdown voltage characteristic may add to the physical size of the enhancement mode NFET 302 and require special consideration during design and layout of the device, for example. Depletion mode NFETs 310 and 306 are also designed with a breakdown voltage of at least Vpp. Thus, a reduction in circuit design and layout complexity can be realized by using a depletion mode NFET 402, similar to the depletion mode NFETs 306 and 310, as these devices are already included in the circuit design and layout. It should be noted that it is shown in FIG. 4 that the gate of the depletion mode NFET 402 is coupled to a voltage source supplying a potential of 0V 420, for example.

Figure 5:
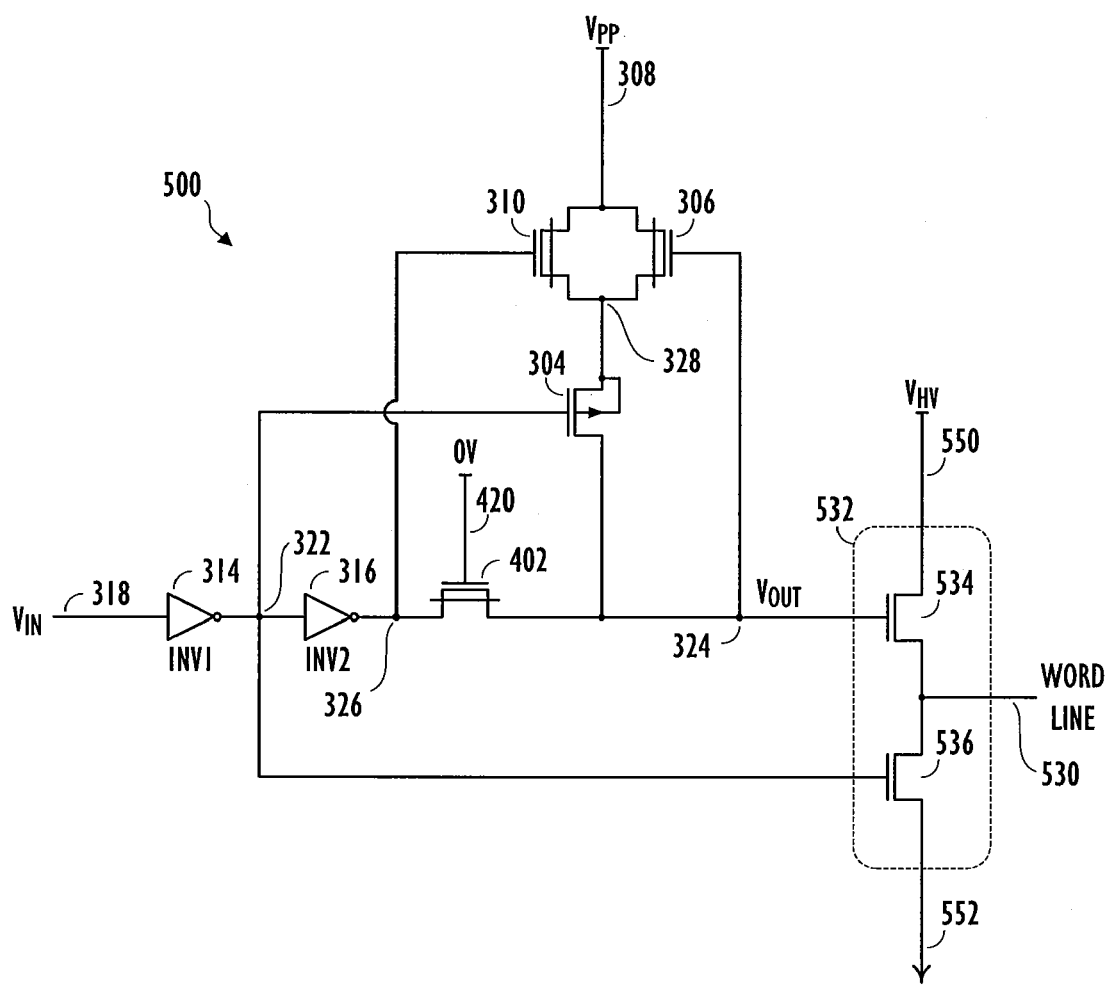
FIG. 5 shows a circuit diagram of an implementation of a level shifting circuit in a memory device according to an embodiment of the present disclosure.

FIG. 5 illustrates the level shifting circuit according to one or more embodiments of the present disclosure such as shown in FIG. 4 as it might be implemented in a memory device 500. For example, memory devices, such as flash memory devices, typically comprise one or more arrays of floating gate memory cells where each array is logically arranged in rows and in columns. In a conventional NAND Flash architecture, "rows" refers to memory cells having commonly coupled control gates. The array is accessed by a row decoder 532 activating a logical row of memory cells by selecting a particular access line, often referred to as a word line 530, for example. Each word line 530 is coupled to the control gates of a row of memory cells. The row decoder 532 is coupled to a voltage source $V_{HV}$ 550 through a transistor 534. The row decoder 532 is also coupled to a ground potential node 552 through another transistor 536. The row decoder 532 facilitates driving the word line 530 to a potential of the voltage source $V_{HV}$ 550 or to the ground potential node 552. Voltage source $V_{HV}$ 550 might be a high voltage source providing a voltage used during a programming operation of the memory device, for example.

Figure 6:
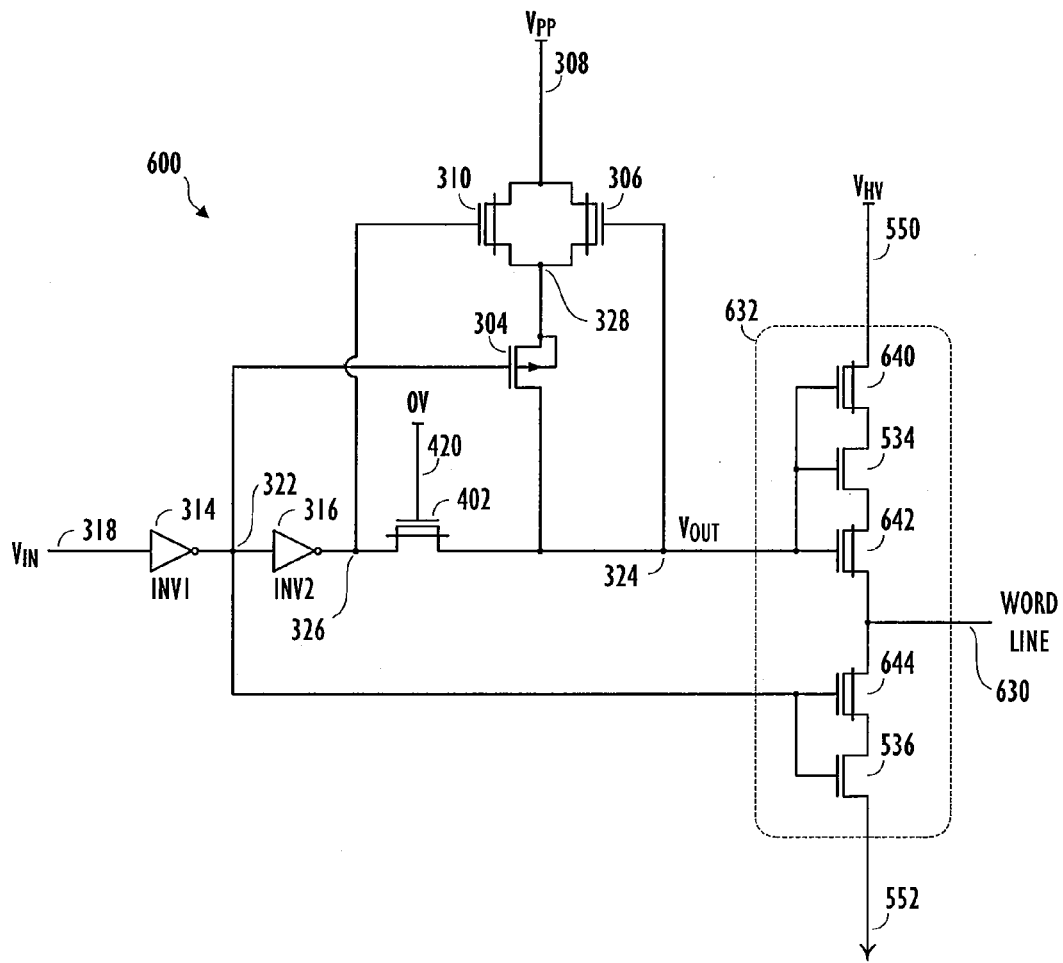
FIG. 6 shows an additional circuit diagram of an implementation of a level shifting circuit in a memory device according to an embodiment of the present disclosure.

FIG. 6 illustrates an additional implementation of a level shifting circuit according to one or more embodiments of the present disclosure in a memory device 600, such as a flash memory device, for example. A word line 630 of the memory device is coupled to the row decoder 632. The row decoder 632 of FIG. 6 is similar in configuration and functionality as the row decoder 532 discussed above with respect to FIG. 5. However, the row decoder 632 of FIG. 6 comprises additional depletion mode transistors 640-644, for example. These depletion mode transistors 640-644 might provide protection for transistors 534 and 536 at the circuit nodes where a high voltage sourced from the $V_{HV}$ supply 550 might be present during operation of the device, for example.

Figure 7:
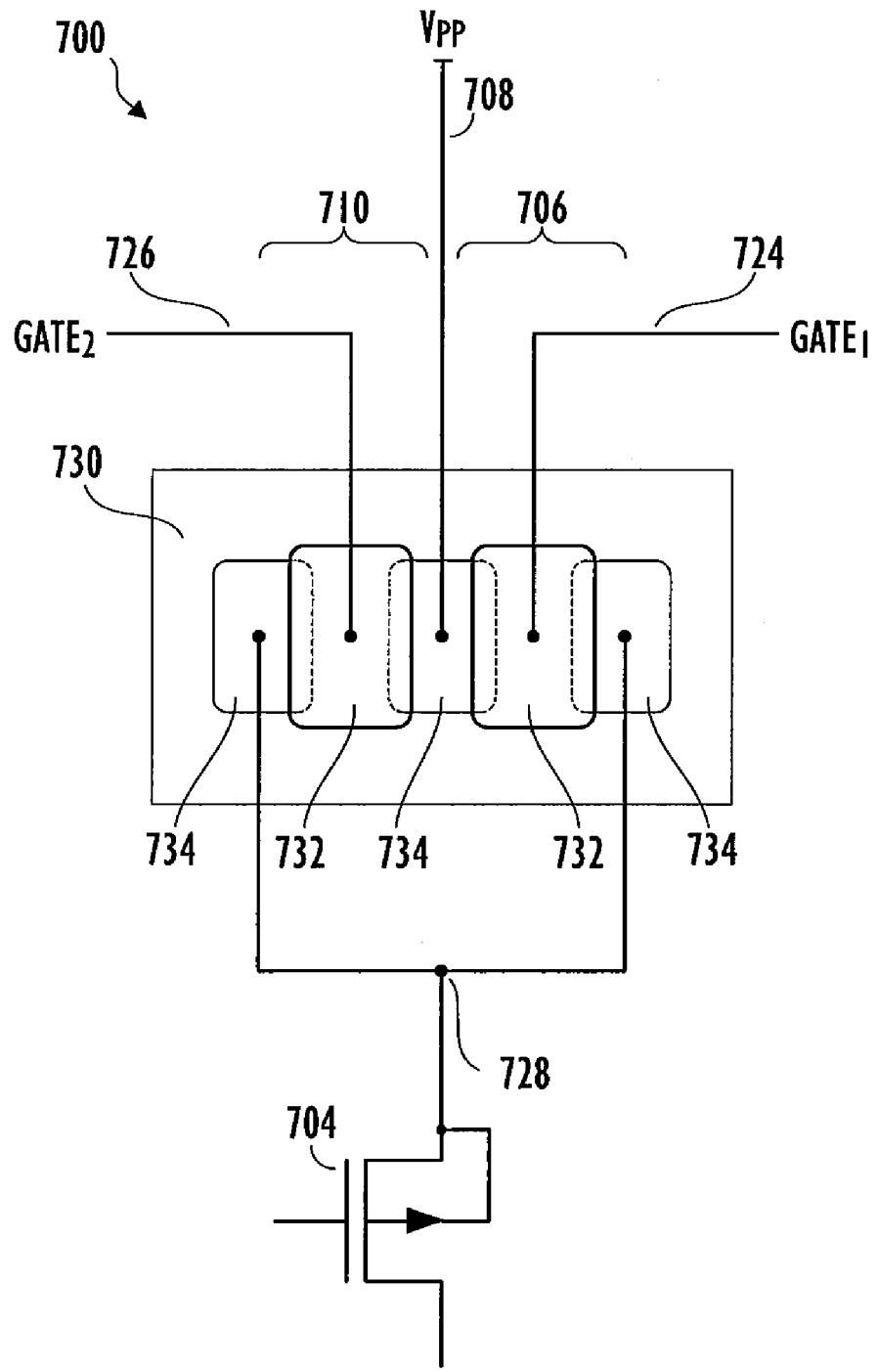
FIG. 7 shows a circuit layout diagram of transistors according to an embodiment of the present disclosure.
Figure 8:
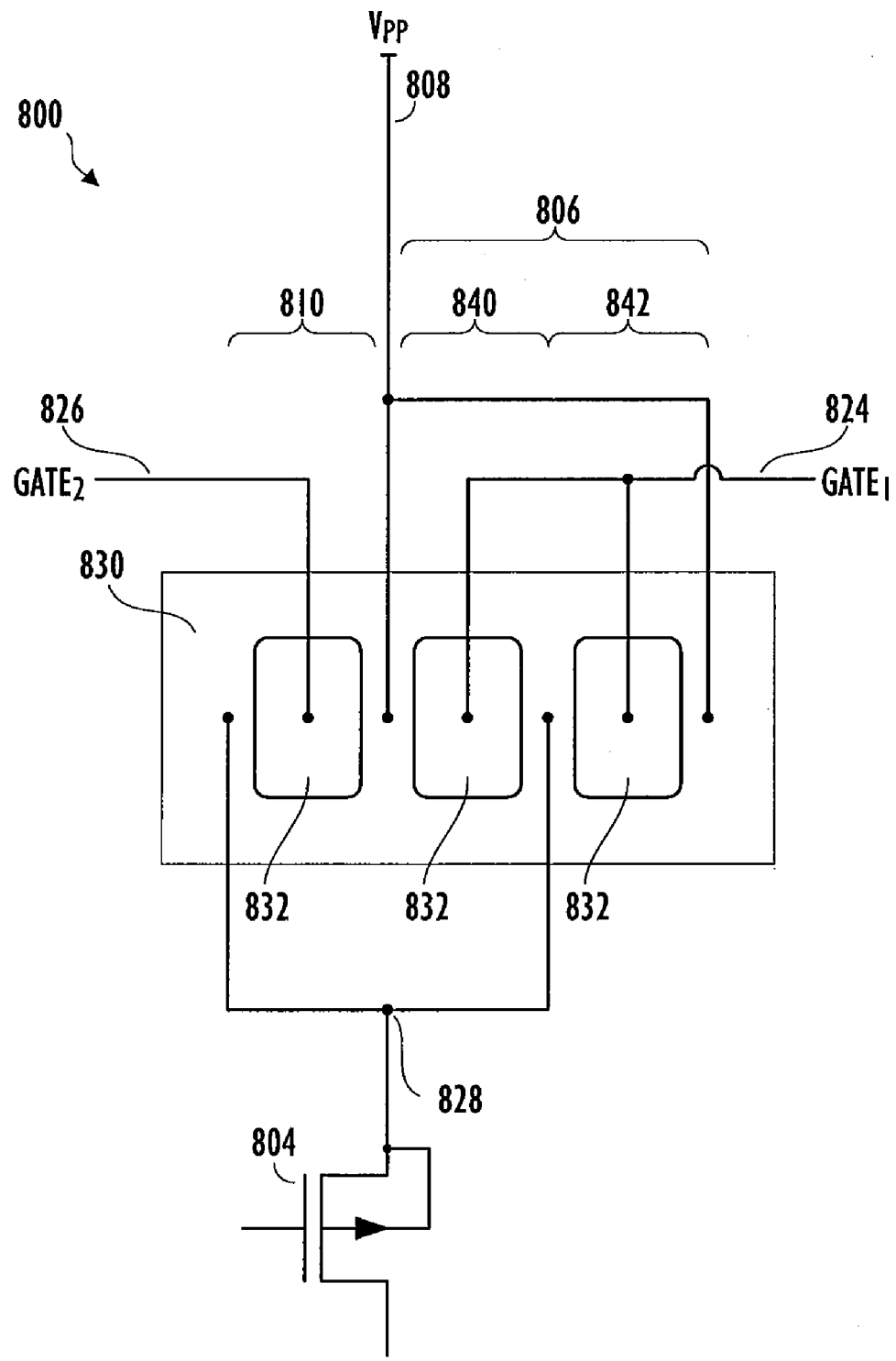
FIG. 8 illustrates a circuit layout diagram of transistors according to an embodiment of the present disclosure.

FIGS. 7 and 8 illustrate a circuit design (e.g., physical) layout representation (e.g., top view) of depletion mode NFETs, such as depletion mode NFETs 310 and 306 shown in FIG. 3, for example. The circuit design layouts shown in FIGS. 7 and 8 might be utilized in the layout of a memory device utilizing level shifting circuits according to various embodiments of the present disclosure. The enhancement mode PFETs 704 and 804 shown in FIGS. 7 and 8, respectively, correspond to the enhancement mode PFET 304, such as discussed above with respect to FIG. 3, for example. The regions 732 and 832 in FIGS. 7 and 8, respectively, correspond to control gates of the transistors. Regions 730 and 830 are representative of a semiconductor substrate that the depletion mode NFETS, such as 310 and 306, might be formed on. Vpp connections 708 and 808 of FIGS. 7 and 8 correspond to the Vpp 308 connection as shown in FIG. 3.

FIG. 7 illustrates a circuit design layout 700 utilizing two similarly configured depletion mode NFETs 710 and 706. For example, depletion mode NFETs 710 and 706 correspond to depletion mode NFETs 310 and 306, respectively, of FIG. 3. Depletion mode NFETs 710 and 706 may be of the same configuration (e.g., size and/or doping) or each may be of differing configuration according to various embodiments of the present disclosure. The substrate 730 may comprise doped regions so as to create source/drain (S/D) regions 734 for each NFET as is known to those skilled in the art. Depletion mode NFETs 710 and 706 of FIG. 7 are connected to the enhancement mode PFET 704 by node 728, where node 728 corresponds to node 328 shown in FIG. 3, for example. The gate connection 726 of depletion mode NFET 710 might be connected to node 326 of FIG. 3 whereas the gate connection 724 of depletion mode NFET 706 might be connected to Vout node 324 of FIG. 3, for example.

FIG. 8 illustrates an additional embodiment of a circuit design layout 800 of depletion mode NFETs according to one or more embodiments of the present disclosure. For example, depletion mode NFET 810 corresponds to depletion mode NFET 310 of FIG. 3. Two or more depletion mode NFETs 840, 842 might be connected in parallel and together 806 correspond to the functionality of depletion mode NFET 306 of FIG. 3, for example. The parallel configuration of the two enhancement mode NFETs 806 might be desirable such as to increase the drive current handling of the level shifting circuit, for example. Although not shown in FIG. 8, more than two NFETs 840, 842 might be connected in parallel to comprise the enhancement mode NFET functionality of 806 according to various embodiments of the present disclosure. Additionally, depletion mode NFET 810 might also comprise two or more NFETs connected in parallel similar to the configuration of NFETs 840 and 842, for example. Depletion mode NFETs 810, 840 and 842 might all be of the same configuration (e.g., size and/or doping) or may be of differing configuration according to various embodiments of the present disclosure. The substrate 830 comprises doped regions similar to regions 734 of FIG. 7, so as to create source/drain regions for each depletion mode NFET 810, 840 and 842. These source/drain regions are not shown in FIG. 8 to improve readability of the Figure.

The depletion mode NFETs 810, 840 and 842 of FIG. 8 are connected to the enhancement mode PFET 804 at node 828. Node 828 corresponds to node 328 shown in FIG. 3 according to various embodiments of the present disclosure, for example. The gate connection 826 of depletion mode NFET 810 might be connected to node 326 of FIG. 3 whereas the combined gate connection 824 of the two NFETs 840 and 842 might be connected to Vout node 324 of FIG. 3 according to various embodiments.

Figure 9:
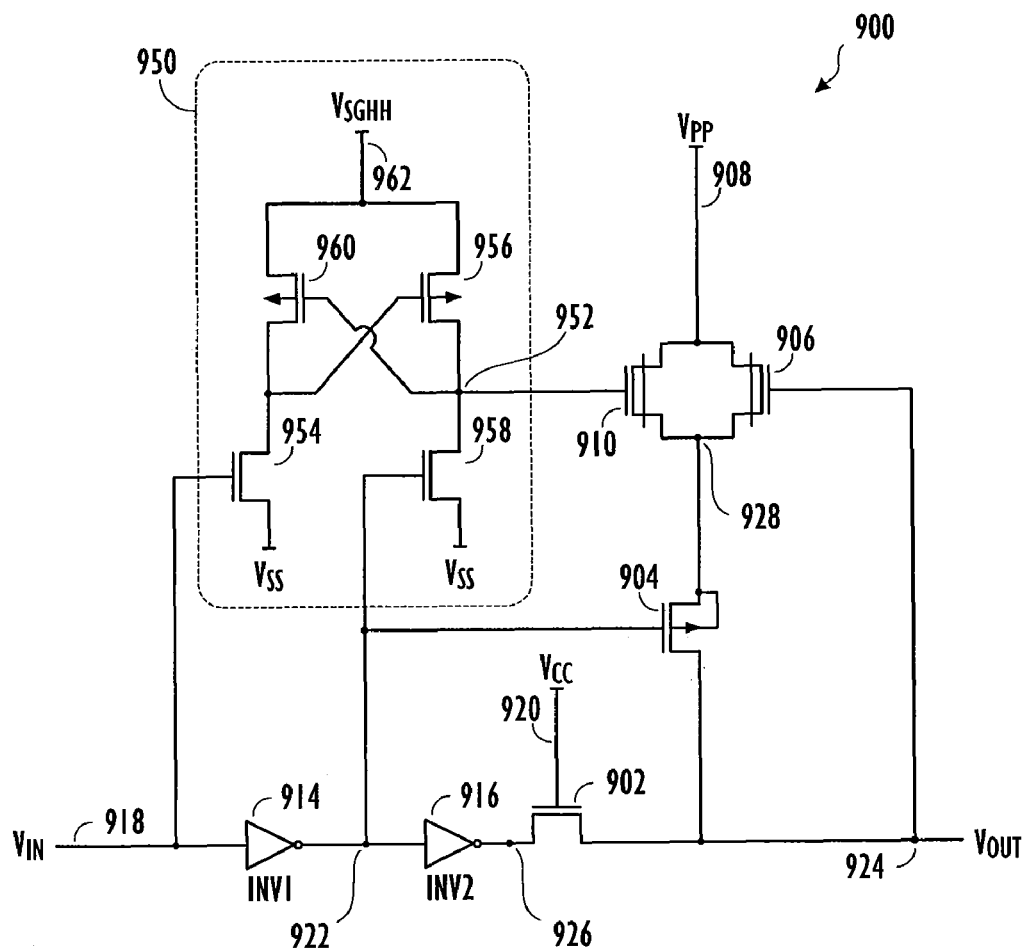
FIG. 9 illustrates a circuit diagram of a level shifting circuit according to an embodiment of the present disclosure.

FIG. 9 illustrates a further embodiment according to one or more embodiments of the present disclosure. The circuit 900 shown in FIG. 9 includes a second depletion mode NFET 910 connected in parallel with a first depletion mode NFET 906, such as depletion mode NFETs 310 and 306 shown in FIG. 3, respectively. The gate of depletion mode NFET 310 shown in FIG. 3 is connected to the output of inverter INV2 316. In contrast with FIG. 3, the gate of depletion mode NFET 910 of FIG. 9 is instead connected to and driven by circuit 950. For example, circuit 950 comprises a CMOS level shifting circuit. The gate of the depletion mode NFET 910 is connected to circuit 950 at node 952. Circuit 950 is supplied by a voltage source 962 (e.g., Vsghh) which might be greater than Vcc 920. Vcc might be 3V and Vsghh might be 4V, for example.

A logic 0 level input at $V_{IN}$ 918 turns off transistor 954. INV1 914 inverts the logic 0 at $V_{IN}$ 918 to a logic 1 at node 922. This turns on transistor 958 which pulls node 952 along with the connected gate of depletion mode NFET 910 to Vss (e.g., ground) and disables depletion mode NFET 910. The logic 1 level of node 922 also turns off (e.g., deactivates) enhancement mode PFET 904. INV2 916 inverts the logic 1 at node 922 to a logic 0 at node 926. The presence of Vcc 920 on the gate of enhancement mode NFET 902 and the logic 0 (e.g., ground) at node 926 causes enhancement mode NFET 902 to pull the Vout node 924 to a logic 0 level. Thus, as described with respect to FIG. 3, the enhancement mode NFET 902 acts as a pass through transistor when $V_{IN}$ 918 is biased to a logic 0 potential.

A logic 1 level at $V_{IN}$ 918 causes transistor 954 to turn on which pulls the gate of transistor 956 to Vss turning on transistor 956. INV1 914 inverts the logic 1 at $V_{IN}$ to a logic 0 level at node 922 turning off transistor 958. As transistor 956 is on and 958 is off, node 952 and the gate of depletion mode NFET 910 are pulled up to Vsghh. The logic 0 at node 922 also pulls the gate of enhancement mode PFET 904 to a low potential, such as 0V. Thus, enhancement mode PFET 904 will turn on if the voltage present at node 928 is greater than the Vtp of the enhancement mode PFET 904. The logic 0 at node 922 is inverted to a logic 1 at node 926 by INV2 916 which turns off enhancement mode NFET 902. Vout node 924, as discussed above with respect to FIG. 3, is initially biased to (Vcc−Vtn) in response to a transition of a logical 0 to a logical 1 at $V_{IN}$ 918, where Vtn is the threshold voltage of enhancement mode NFET 902. Without the benefit of depletion mode NFET 910 configured according to various embodiments of the present disclosure, the initial voltage present at node 928 would be $V_{NODE728}$=(|Vtd|+Vcc−Vtn), where Vtd is the threshold voltage of the depletion mode NFET 906 and Vtn is the threshold voltage of the enhancement mode NFET 902. As the gate voltage of the enhancement mode PFET 904 is pulled low, the enhancement mode PFET 904 will only begin to turn on if the voltage at node 928 is above the threshold voltage (Vtp) of the enhancement mode PFET 904. Having the benefit of the depletion mode NFET 910 according to various embodiments of the present disclosure, the gate of depletion mode NFET 910 is pulled up to Vsghh through transistor 956 when $V_{IN}$ 918 is at logical 1 level. Thus, according to various embodiments the initial voltage on node 928 will be Vsghh+Vtd instead of (|Vtd|+Vcc−Vtn) as would occur without depletion mode NFET 910. Therefore, the condition for successful operation of the level shifting circuit of FIG. 9 is (Vsghh+Vtd)>|Vtp|. Thus, the initial voltage present at node 928 is Vsghh+Vtd according to various embodiments of the present disclosure which is greater than the initial voltage of (|Vtd|+Vcc−Vtn) according to the prior art such as shown in FIG. 1A, for example. Thus, the one or more embodiments of the present disclosure allow for successful operation with a reduction of the operating Vcc and/or utilizing transistors having larger threshold voltages (e.g., Vtd, Vtp, Vtn) than can be realized with the level shifting circuit of the prior art as shown in FIG. 1A. It should be noted that the various embodiments of the present disclosure significantly reduces the effect of Vtn (e.g., the threshold voltage of enhancement mode NFET 902) on the initial voltage present at node 928. Thus, according to one or more embodiments the initial voltage present at node 928 can be increased along with a decrease in the minimum supply voltage required for reliable operation of the level shifter circuit.

According to additional embodiments of the present disclosure, the enhancement mode NFET 902 of FIG. 9 might also be replaced with a depletion mode NFET, such as the depletion mode NFET 402 with the gate biased to 0V 420 such as shown in FIG. 4, for example.

Figure 10:
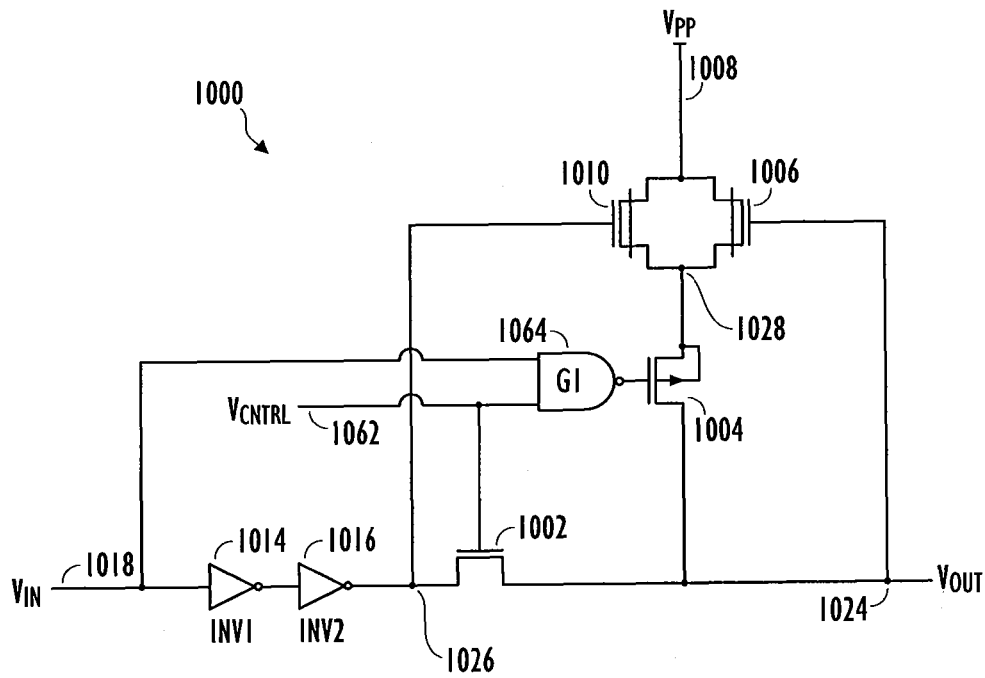
FIG. 10 illustrates a circuit diagram of a level shifting circuit according to an embodiment of the present disclosure.

FIG. 10 illustrates yet another level shifting circuit according to one or more embodiments of the present disclosure. Similar to the embodiment shown in FIG. 3, FIG. 10 comprises a second depletion mode NFET 1010 in parallel with a first depletion mode NFET 1006. The gate of depletion mode NFET 1010 is connected to the output of inverter INV2 1016 by node 126. The gate of the first depletion mode NFET 1006 is connected to Vout node 1024. The two depletion mode NFETs 1006 and 1010 are connected to the enhancement mode PFET 1004 at node 1028.

The gate of the enhancement mode NFET 1002 is connected to a control signal line VCNTRL 1062, as opposed to being connected to a substantially constant potential, such as Vcc as shown in FIG. 3. The voltage present on VCNTRL 1062 might range from 0V to Vcc, for example. The circuit shown in FIG. 10 also comprises a NAND gate 1064 with one input connected to $V_{IN}$ 1018 and the second input connected to the VCNTRL 1062 signal line. The output of the NAND gate 1064 is connected to the enhancement mode PFET 1004. The output of the NAND gate 1064 may transition between 0V (e.g., ground) and Vcc, where a 0V output corresponds to a logic 0 level and an output of Vcc corresponds to a logic 1 level, for example. The input/output function of NAND logic gates are known to those skilled in the art. It should be noted that additional embodiments according to the present disclosure might utilize different combinational logic circuits (e.g., logic gates) in combination with the NAND gate 1064, or might be used in place of the NAND gate 1064 shown in FIG. 10, for example.

A logic 0 level at $V_{IN}$ 1018 which is also present at an input to the NAND gate 1064, causes the output of the NAND gate 1064 to be a logic 1 (e.g., Vcc) regardless of the voltage level of the VCNTRL signal 1062 connected to the second input of the NAND gate. The logic 1 level present at the output of the NAND gate 1064 turns off the enhancement mode PFET 1004. The logic 0 level of $V_{IN}$ 1018 is twice inverted by inverters INV1 1014 and INV2 1016 resulting in a logic 0 present at node 1026. A logic 1 level present on the VCNTRL line and the logic 0 level on node 1026 turns on the enhancement mode NFET 1002 and thus pulls the Vout node 1024 down to a logic 0 (e.g., ground) potential. Thus, as discussed above with respect to one or more embodiments, the enhancement mode NFET 1002 acts as a pass through gate to pull down the Vout node 1024 to a logic 0 level when a logic 0 level is present at $V_{IN}$ 1018.

A transition from a logic 0 level to a logic 1 level at $V_{IN}$ 1018 along with a logic 1 level (e.g., Vcc) present on the VCNTRL signal line 1062 causes the NAND gate 1064 output connected to the enhancement mode PFET 1004 to be pulled to a logic 0 level. The logic 1 level of $V_{IN}$ 1018 is twice inverted by inverters INV1 1014 and INV2 1016 resulting in a logic 1 level present at node 1026. This logic 1 level (e.g., Vcc) on node 1026 also biases the gate of the depletion mode NFET 1010 to Vcc. Thus, the voltage present on node 1028 is initially (Vcc−Vtd), where Vtd is the threshold voltage of the second depletion mode NFET 1010. Further, the enhancement mode NFET 1002 is turned off as node 1026 and the gate of the enhancement mode NFET 1002 are both at the same potential (e.g., logic 1 level). Vout node 1024 will therefore be pulled up to Vpp as depletion mode NFET 1010 and 1006 along with enhancement mode PFET 1004 are each turned on. Although not shown in FIG. 10, the even number of series connected inverters INV1 1014 and INV2 1016 might be implemented by a single, non-inverting buffer circuit according to one or more embodiments of the present disclosure, for example. It should be noted that the depletion mode NFET 1006, the enhancement mode PFET 1004 and NAND gate 1064 together serve as a feedback (e.g., positive feedback) circuit, such as feedback circuit 222 discussed above and shown in FIG. 2A, for example.

Figure 11:
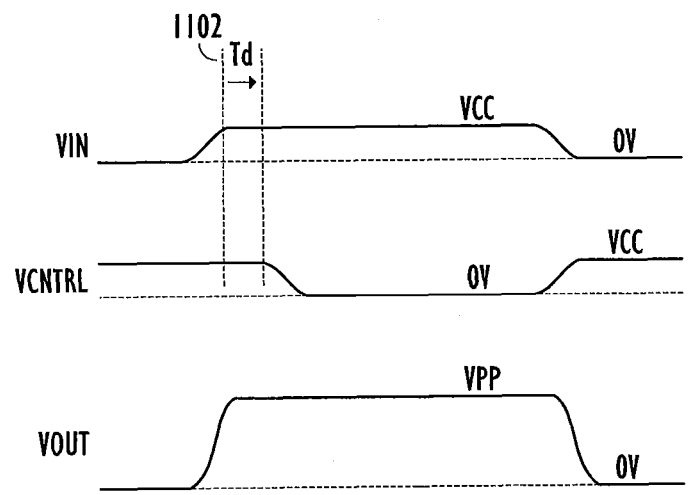
FIG. 11 illustrates a plot of waveforms corresponding to the circuit diagram of FIG. 10 according to an embodiment of the present disclosure.

FIG. 11 illustrates various waveforms corresponding to the circuit illustrated by FIG. 10 according to one or more embodiments of the present disclosure. FIG. 11 shows the $V_{IN}$ waveform along with the corresponding Vout waveform for the circuit of FIG. 10. In addition, a waveform representative of the voltage waveform of VCNTRL 1062 of FIG. 10 is also illustrated in FIG. 11.

NAND gate 1064 of FIG. 10 can also help to reduce gate stresses on the enhancement mode PFET 1004. For example, VCNTRL 1062 might be transitioned to a logic 0 level after the output of the level shifter circuit has been successfully pulled up to Vpp such as shown by the VCNTRL waveform of FIG. 11. The VCNTRL signal might be driven to a logic 0 (e.g., 0V) after a particular delay Td 1102 and after Vout has been successfully pulled up to Vpp. Driving VCNTRL low after a delay Td 1102 and Vpp has been established at Vout causes the output of the NAND gate 1064 to switch from a logic 0 level to a logic 1 level (e.g., Vcc). Thus, the voltage drop (e.g., gate stress) across the enhancement mode PFET 1004 might be reduced by the logic 1 output voltage level (e.g., Vcc) of the NAND gate 1064. For example, a logic 0 output of the NAND gate and a Vpp=20V might result in a 20V drop (20V−0V) across the enhancement mode PFET 1004 when Vout is pulled up to Vpp. By driving VCNTRL low and causing the output of the NAND gate 1064 to switch to logic 1 level where Vcc=3V, the resulting voltage drop across the PFET will been reduced to a 17V drop (20V−3V) across enhancement mode PFET 1004 when Vout is pulled up to Vpp, for example. It should be noted that although the gate of the enhancement mode PFET 1004 is being driven to a logic 1 by the output of the NAND gate 1064 after VCNTRL is driven low, the enhancement mode PFET 1004 remains in an on state due to the connection of the well of the transistor to node 1028 which maintains the well bias of the PFET at Vpp. This gate stress reduction scheme is disclosed in U.S. Pat. No. 7,272,046, issued Sep. 18, 2007, which is commonly assigned with the present disclosure. In addition, the connection of VCNTRL to the gate of the enhancement mode NFET 1002 also serves to reduce leakage current from the Vout node 1024 when Vout is biased up to Vpp, for example.

Figure 12:
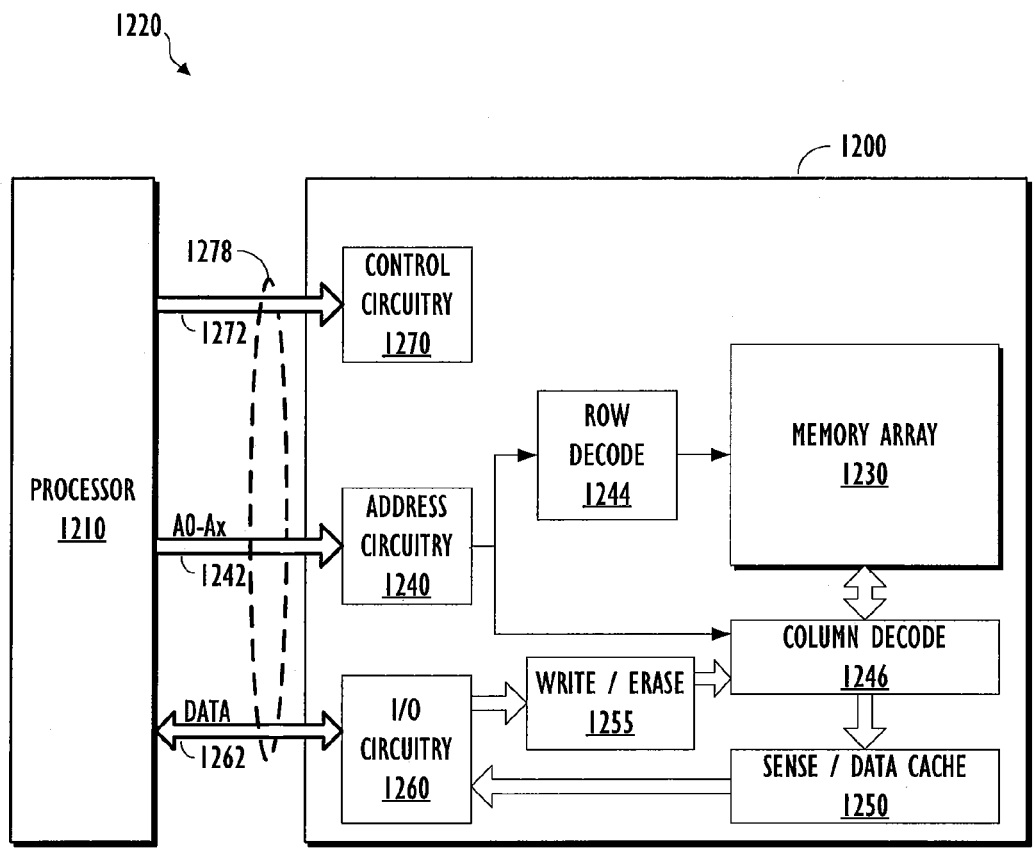
FIG. 12 shows an electronic system including a memory device utilizing a level shifting circuit according to an embodiment of the present disclosure.

FIG. 12 is a functional block diagram of an electronic system having at least one memory device incorporating at least one level shifting circuit embodiment according to various embodiments of the present disclosure. The memory device 1200 illustrated in FIG. 12 is coupled to a host such as a processor 1210. The processor 1210 may be a microprocessor or some other type of controlling circuitry. The memory device 1200 and the processor 1210 form part of an electronic system 1220. The memory device 1200 has been simplified to focus on features of the memory device that are helpful in understanding various embodiments of the present disclosure.

The memory device 1200 includes one or more arrays of memory cells 1230 that can be logically arranged in banks of rows and columns. Memory array 1230 may comprise single level and/or multi-level Flash memory cells, for example. The memory array 1230 might include multiple banks and blocks of memory cells residing on a single or multiple die as part of the memory device 1200.

An address buffer circuit 1240 is provided to latch address signals provided on address input connections A0-Ax 1242. Address signals are received and decoded by a row decoder 1244 and a column decoder 1246 to access the memory array 1230. It will be appreciated by those skilled in the art, with the benefit of the present description, that the number of address input connections 1242 depends on the density and architecture of the memory array 1230. That is, the number of address digits increases with both increased memory cell counts and increased bank and block counts, for example.

The memory device 1200 reads data in the memory array 1230 by sensing voltage or current changes in the memory array columns using sense/data cache circuitry 1250. The sense/data cache circuitry 1250, in at least one embodiment, is coupled to read and latch a row of data from the memory array 1230. Data input and output buffer circuitry 1260 is included for bi-directional data communication over a plurality of data connections 1262 with the processor 1210. Write/erase circuitry 1255 is provided to write data to or to erase data from the memory array 1230. The write/erase circuitry 1255 might comprise level shifting circuits according to various embodiments of the present disclosure, for example.

Control circuitry 1270 is configured at least in part to interface with the level shifting circuits according to various embodiments of the present disclosure. For example, level shifting circuits according to one or more embodiments of the present disclosure are utilized to allow the control circuitry 1270 of the memory device 1200 to switch high voltages (e.g., programming voltages such as Vpp) to be supplied to the memory array 1230 as part of programming and/or erasure operations. In at least one embodiment, the control circuitry 1270 may utilize a state machine. Control signals and commands can be sent by the processor 1210 to the memory device 1200 over the command bus 1272. The command bus 1272 may be a discrete signal or may be comprised of multiple signals, for example. These command signals 1272 are used to control the operations on the memory array 1230, including data read, data write (e.g., program), and erase operations. The command bus 1272, address bus 1242 and data bus 1262 might all be combined or might be combined in part to form a number of standard interfaces 1278. For example, the interface 1278 between the memory device 1200 and the processor 1210 may be a Universal Serial Bus (USB) interface. The interface 1278 may also be a standard interface used with many hard disk drives (e.g., SATA, PATA) as are known to those skilled in the art.

The electronic system illustrated in FIG. 12 has been simplified to facilitate a basic understanding of the features of the memory and is for purposes of illustration only. A more detailed understanding of internal circuitry and functions of non-volatile memories are known to those skilled in the art.

CONCLUSION

In summary, level shifting circuits according to one or more embodiments of the present disclosure provide for reducing the minimum supply voltage necessary to maintain operation of a level shifting circuit. The various embodiments further provide for the use of higher threshold voltage transistors in implementing the various level shifting circuit embodiments without the need to increase circuit supply voltages in order to maintain reliable operation. Although various embodiments of the present disclosure have been discussed being incorporated into memory devices, it should be noted that the one or more embodiments are not limited to use only in memory devices.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A level shifting circuit, comprising:
   an input node coupled to receive an input signal having a logic level;
   a first voltage source;
   an output node coupled to provide in response to the input signal one of a voltage potential of the first voltage source and a ground potential;
   a first transistor comprising a control gate coupled to the input node;
   a second transistor comprising a control gate coupled to a second voltage source; and
   a feedback circuit coupled between the first voltage source and the output node;
   wherein the first transistor is coupled between the first voltage source and the feedback circuit; and
   wherein the second transistor is coupled between the input node and the output node.

2. The level shifting circuit of claim 1, wherein the feedback circuit comprises a depletion mode n-channel field effect transistor and an enhancement mode p-channel field effect transistor coupled in series where the depletion mode transistor is coupled to the first voltage source and where the p-channel transistor is coupled to the output node.

3. The level shifting circuit of claim 2, wherein the first transistor is coupled to the feedback circuit at a node between the series coupled depletion mode transistor and the p-channel transistor.

4. A level shifting circuit, comprising:
   a first transistor coupled between a first voltage source and a first node, wherein the first transistor comprises a control gate coupled to an output node;
   a second transistor coupled in parallel with the first transistor between the first voltage source and the first node;
   a third transistor coupled between the first node and the output node; and
   a fourth transistor coupled between a second node and the output node, wherein the fourth transistor comprises a control gate coupled to a second voltage source;
   wherein the second transistor comprises a control gate coupled to receive a first signal having a logic level to deactivate the second transistor when the fourth transistor is activated and to activate the second transistor when the fourth transistor is deactivated; and
   wherein the third transistor comprises a control gate coupled to receive a second signal having a logic level to activate the third transistor when the second transistor is activated and to deactivate the third transistor when the second transistor is deactivated.

5. The level shifting circuit of claim 4, wherein the first transistor and the second transistor each comprise a depletion mode n-channel field effect transistor and where the third transistor comprises an enhancement mode p-channel field effect transistor.

6. The level shifting circuit of claim 4, wherein the fourth transistor comprises a transistor selected from the group consisting of a depletion mode n-channel field effect transistor and an enhancement mode n-channel field effect transistor.

7. The level shifting circuit of claim 4, wherein the first voltage source supplies a higher voltage potential than a voltage potential supplied by the second voltage source.

8. The level shifting circuit of claim 4, wherein the control gate of the second transistor is coupled to the second node to receive the first signal.

9. The level shifting circuit of claim 4, further comprising;
an input node coupled to receive an input signal having a logic level;
wherein the level shifting circuit is configured to provide the first signal having the logic level of the input signal;
wherein the level shifting circuit is configured to provide the second signal having an opposite logic level of the input signal; and
wherein the level shifting circuit is configured to provide a signal to the second node having the logic level of the input signal.

10. The level shifting circuit of claim 9, wherein a logic 1 level present on the input node and on the second node is equal to a voltage level of the second voltage source and a logic 1 level present on the output node is equal to a voltage level of the first voltage source and where a logic 0 level present on the input node and on the output node is a ground potential.

11. A level shifting circuit, comprising:
a first transistor coupled between a first voltage source and a first node, wherein the first transistor comprises a control gate coupled to an output node;
a second transistor coupled in parallel with the first transistor between the first voltage source and the first node, wherein the second transistor comprises a control gate coupled to a second node;
a third transistor coupled between the first node and the output node, wherein the third transistor comprises a control gate coupled to a third node;
a fourth transistor coupled between a fourth node and the output node, wherein the fourth transistor comprises a control gate coupled to a second voltage source;
a first signal inverter having an output coupled to the fourth node and configured to generate a first signal having a logic level to activate the fourth transistor when the second transistor is deactivated and to deactivate the fourth transistor when the second transistor is activated;
a second signal inverter having an output coupled to the third node and configured to generate a second signal having a logic level to activate the third transistor when the fourth transistor is deactivated and to deactivate the third transistor when the fourth transistor is activated; and
an internal level shifter circuit having an output coupled to the second node and configured to generate a third signal having a logic level to activate the second transistor when the third transistor is activated and to deactivate the second transistor when the third transistor is deactivated.

12. The level shifting circuit of claim 11, further comprising an input node coupled to receive an input signal having a logic level, wherein the first and the third signals comprise logic levels equal to the input signal logic level and where the second signal comprises a logic level opposite of the input signal logic level.

13. The level shifting circuit of claim 11, wherein the third signal comprises a logic signal of one of a voltage level of a third voltage source and a ground potential.

14. The level shifting circuit of claim 11, wherein the first voltage source supplies a higher voltage potential than a voltage potential supplied by the third voltage source and where the voltage potential supplied by the third voltage source is higher than a voltage potential supplied by the second voltage source.

15. A level shifting circuit, comprising:
a first input node coupled to receive a first input signal having a logic level;
a second input node coupled to receive a second input signal having a logic level;
a first transistor coupled between a first voltage source and a first node, wherein the first transistor comprises a control gate coupled to an output node;
a second transistor coupled in parallel with the first transistor between the first voltage source and the first node, wherein the second transistor comprises a control gate coupled to a second node;
a logic gate circuit wherein the logic gate circuit comprises a first input coupled to the first input node, a second input coupled to the second input node and an output;
a third transistor coupled between the first node and the output node, wherein the third transistor comprises a control gate coupled to the logic gate circuit output;
a fourth transistor coupled between the second node and the output node, wherein the fourth transistor comprises a control gate coupled to the second input node; and
a buffer circuit coupled between the first input node and the second node and configured to generate a first signal having a logic level to deactivate the second transistor when the fourth transistor is activated and to activate the second transistor when the fourth transistor is deactivated;
wherein the logic gate circuit is configured to output a second signal having a logic level to activate the third transistor when the second transistor is activated and to deactivate the third transistor when the second transistor is deactivated.

16. The level shifting circuit of claim 15, wherein the logic gate circuit comprises a NAND type logic gate.

17. The level shifting circuit of claim 15, wherein the buffer circuit comprises an even number of series connected inverter circuits.

18. The level shifting circuit of claim 15, wherein the logic gate circuit is configured to output the second signal in response a logic level of the first input node and a logic level of the second input node.

19. The level shifting circuit of claim 15, wherein the fourth transistor is activated and deactivated in response to the first signal and the logic level of the second input node.

20. A memory device, comprising:
a memory device interface configured to be coupled with a host device;
an array of non-volatile memory cells logically arranged in rows and in columns;
a controller, wherein the controller is configured to interface with a host device coupled to the memory device interface and to facilitate one or more memory device operations on the array of memory cells; and a level shifting circuit, comprising:
- a first transistor coupled between a first voltage source and a first node, wherein the first transistor comprises a control gate coupled to an output node;
- a second transistor coupled in parallel with the first transistor between the first voltage source and the first node, wherein the second transistor comprises a control gate coupled to a second node;
- a third transistor coupled between the first node and the output node, wherein the third transistor comprises a control gate coupled to a third node;
- a fourth transistor coupled between the second node and the output node, wherein the fourth transistor comprises a control gate coupled to a second voltage source;
- a first signal inverter having an output coupled to the second node and configured to generate a first signal having a logic level to deactivate the second transistor when the fourth transistor is activated and to activate the second transistor when the fourth transistor is deactivated; and
- a second signal inverter having an output coupled to the third node and configured to generate a second signal having a logic level to activate the third transistor when the second transistor is activated and to deactivate the third transistor when the second transistor is deactivated.

21. The memory device of claim 20, wherein the level shifting circuit further comprises:
- an input node coupled to receive an input signal having a logic level;
- wherein the level shifting circuit is configured to provide the first signal having the logic level of the input signal; and
- wherein the level shifting circuit is configured to provide the second signal having an opposite logic level of the input signal.

22. The memory device of claim 21, wherein an input of the second signal inverter is coupled to the input node, an input of the first signal inverter is coupled to the third node and where a logical level of the input node is the same logic level of the output of the first inverter.

23. The memory device of claim 20, wherein the third transistor comprises an enhancement mode p-channel field effect transistor and where the first transistor and the second transistor each comprise a depletion mode n-channel field effect transistor.

24. The memory device of claim 20, wherein the fourth transistor comprises a transistor selected from the group consisting of a depletion mode n-channel field effect transistor and an enhancement mode n-channel field effect transistor.

25. The memory device of claim 20, wherein the first voltage source supplies a higher voltage potential than a voltage potential supplied by the second voltage source.

* * * * *